US007970984B2

(12) United States Patent
Lasser et al.

(10) Patent No.: US 7,970,984 B2
(45) Date of Patent: Jun. 28, 2011

(54) METHOD FOR USING A MULTI-BIT CELL FLASH DEVICE IN A SYSTEM NOT DESIGNED FOR THE DEVICE

(75) Inventors: Menahem Lasser, Kohav Yair (IL); Avraham Meir, Rishon Lezion (IL)

(73) Assignee: SanDisk IL Ltd., Kfar Saba, IL (US)

( * ) Notice: Subject to any disclaimer, the term of this patent is extended or adjusted under 35 U.S.C. 154(b) by 484 days.

(21) Appl. No.: 12/167,306

(22) Filed: Jul. 3, 2008

(65) Prior Publication Data

US 2008/0270682 A1    Oct. 30, 2008

Related U.S. Application Data

(63) Continuation-in-part of application No. 11/051,190, filed on Feb. 7, 2005, now abandoned.

(60) Provisional application No. 60/638,187, filed on Dec. 23, 2004.

(51) Int. Cl.
*G06F 12/00* (2006.01)
*G06F 12/16* (2006.01)
(52) U.S. Cl. ........................................ 711/103; 711/154
(58) Field of Classification Search ................... None
See application file for complete search history.

(56) References Cited

U.S. PATENT DOCUMENTS

| 5,434,825 | A  | * | 7/1995  | Harari         | 365/185.24 |
|-----------|----|---|---------|----------------|------------|
| 5,541,886 | A  | * | 7/1996  | Hasbun         | 365/185.03 |
| 6,067,248 | A  | * | 5/2000  | Yoo            | 365/185.03 |
| 6,327,186 | B1 | * | 12/2001 | Fukuoka        | 365/185.26 |
| 6,426,893 | B1 | * | 7/2002  | Conley et al.  | 365/185.11 |
| 7,761,652 | B2 | * | 7/2010  | Kim et al.     | 711/103    |
| 2004/0057316 | A1 | * | 3/2004 | Kozakai et al. | 365/222   |
| 2005/0160217 | A1 | * | 7/2005 | Gonzalez et al.| 711/6     |
| 2005/0286297 | A1 | * | 12/2005 | Roohparvar    | 365/185.03 |

OTHER PUBLICATIONS

Non-Final Office Action dated Aug. 10, 2006, U.S. Appl. No. 11/051,190, filed Feb. 7, 2005.
Response to Office Action dated Nov. 2, 2006, U.S. Appl. No. 11/051,190, filed Feb. 7, 2005.
Final Office Action dated Jan. 24, 2007, U.S. Appl. No. 11/051,190, filed Feb. 7, 2005.
Response to Office Action dated Mar. 21, 2007, U.S. Appl. No. 11/051,190, filed Feb. 7, 2005.
Non-Final Office Action dated Jun. 20, 2007, U.S. Appl. No. 11/051,190, filed Feb. 7, 2005.
Response to Office Action dated Nov. 19, 2007, U.S. Appl. No. 11/051,190, filed Feb. 7, 2005.
Final Office Action dated Feb. 7, 2008, U.S. Appl. No. 11/051,190, filed Feb. 7, 2005.

* cited by examiner

*Primary Examiner* — Jack A Lane
(74) *Attorney, Agent, or Firm* — Vierra Magen Marcus & DeNiro LLP (57) ABSTRACT

A computerized system is booted from a flash memory device configured to always operate one or more of its blocks only in a M-bit-per-cell mode and the rest of its blocks in a N>M-bit-per-cell mode. When the system is powered up, an initialization program is retrieved from the M-bit-per-cell block(s), corrected for errors using a first error correction method, and executed. Data accessed subsequently from the N-bit-per-cell blocks are corrected using an error correction method that corrects more errors per block than the first error correction method.

15 Claims, 5 Drawing Sheets

METHOD FOR USING A MULTI-BIT CELL FLASH DEVICE IN A SYSTEM NOT DESIGNED FOR THE DEVICE

CROSS REFERENCE TO RELATED APPLICATIONS

This application, published as US 2008/0270682 on Oct. 30, 2008, is a continuation-in-part of and incorporates by reference U.S. patent application Ser. No. 11/051,190, filed Feb. 7, 2005, published as US 2006/0143368 on Jun. 29, 2006, and now abandoned, that, in turn, claims benefit from and incorporates by reference U.S. Provisional Patent Application Ser. No. 60/638,187, filed Dec. 23, 2004.

FIELD AND BACKGROUND OF THE INVENTION

The present invention relates to flash memories and, more particularly, to a method of using a flash memory. Flash memory cells can be programmed with either one bit per cell or more than one bit cell. In particular, the present invention is based on causing a flash device storing more than one bit per cell to emulate the behavior and reliability characteristics during booting of a flash device storing one bit per cell.

Flash memory devices have been known for many years. Typically, each memory cell within a flash memory stores one bit of information. The traditional way to store a bit in a flash memory cell has been by supporting two states of the cell. One state represents a logical "0" and the other state represents a logical "1". In a flash memory cell, the two states are implemented by having a floating gate above the cell's channel (the area connecting the source and drain elements of the cell's transistor), and having two valid states for the amount of charge stored within the floating gate. Typically, one state is with zero charge in the floating gate and is the unwritten state of the cell after being erased (commonly defined to represent the "1" state) and the other state is with some amount of negative charge in the floating gate (commonly defined to represent the "0" state). Having negative charge in the gate causes the threshold voltage of the cell's transistor (i.e. the voltage that has to be applied to the transistor's control gate in order to cause the transistor to conduct) to increase. It is possible to read the stored bit by checking the threshold voltage of the cell. If the threshold voltage is in the higher state then the bit value is "0" and if the threshold voltage is in the lower state then the bit value is "1". Actually there is no need to accurately read the cell's threshold voltage. All that is needed is to correctly identify in which of the two states the cell is currently located. For this purpose it is sufficient to compare the threshold voltage of the cell to a reference voltage that is between the two states, and to determine if the cell's threshold voltage is below or above the reference value.

Figures 1, 1B:
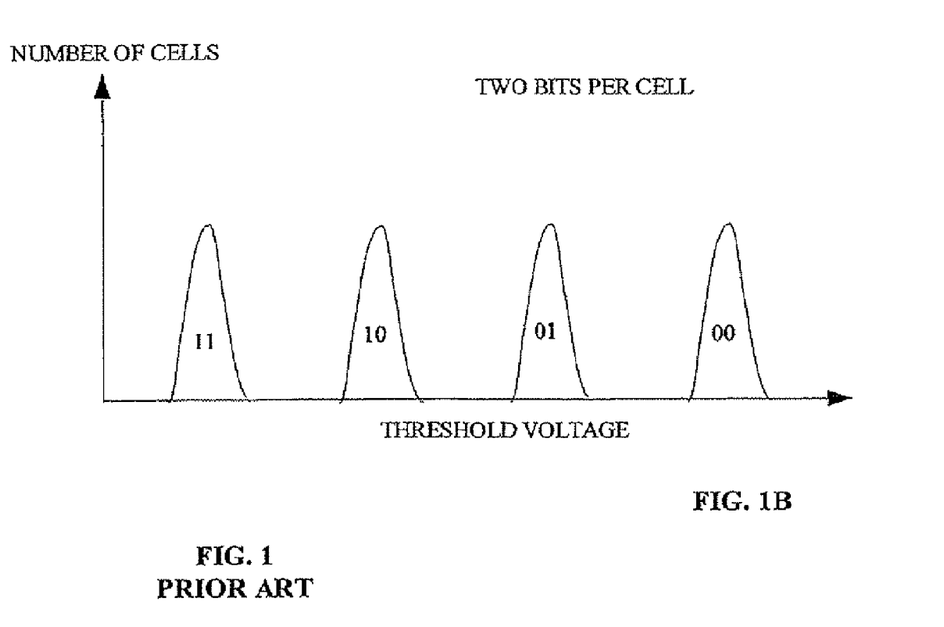
FIG. 1 is a prior art drawing of voltage level distributions for single bit and dual bit flash memory cells.
Figure 1A:
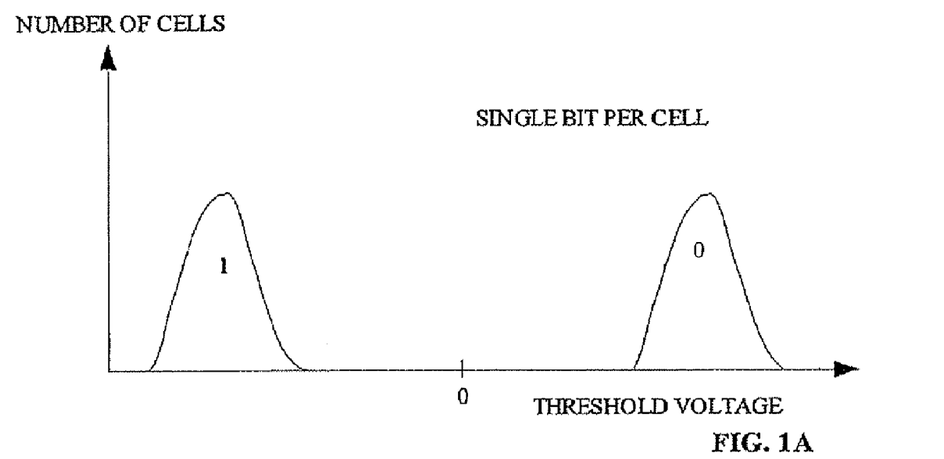

FIG. 1A (prior art) shows graphically how this works. Specifically, FIG. 1A shows a distribution of the threshold voltages of a large population of cells. Because the cells in a flash device are not exactly identical in their characteristics and behavior (due to, for example, small variations in impurity concentrations or defects in the silicon structure), applying the same programming operation to all the cells does not cause all the cells to have exactly the same threshold voltage. Instead, the threshold voltage is distributed as shown in FIG. 1A. Cells storing a value of "1" typically have a negative threshold voltage, such that most of the cells have a threshold voltage close to the central voltage value of the left peak (labeled 1) of FIG. 1A, with fewer cells having threshold voltages lower or higher than the central voltage of the left peak. Similarly, cells storing a value of "0" typically have a positive threshold voltage, such that most of the cells have a threshold voltage close to the central voltage of the right peak (labeled 0) of FIG. 1A, with fewer cells having threshold voltages lower or higher than the central voltage of the right peak.

In recent years, a new kind of flash device has appeared on the market, using "Multi Level Cells" (MLC). The term "Multi-Level Cell" is misleading because flash memory with a single bit per cell uses multiple i.e. two levels, as described above. Therefore, the term "Single Bit Cell" (SBC) is used hereinafter to refer to a memory cell of two levels and the term "Multi-Bit Cell" (MBC) is used hereinafter to refer to a memory cell of more than two levels, i.e. more than one bit per cell. The present discussion is directed primarily to an MBC flash memory with two bits per cell. It should however be understood that the present invention is equally applicable to flash memory devices that support more than two bits per cell.

A single MBC cell storing two bits of information is in one of four different states. As the cell's "state" is represented by the cell's threshold voltage, an MBC cell supports four different valid ranges for the cell's threshold voltage. FIG. 1B (prior art) shows the threshold voltage distribution for a typical MBC cell of two bits per cell. As expected, FIG. 1B has four peaks, each peak corresponding to one state. As for the SBC, each state is actually a voltage range and not a single voltage. When reading the cell's contents, the cell's threshold voltage must be correctly identified in a definite voltage range. For a prior art example of an MBC flash device see U.S. Pat. No. 5,434,825 to Harari.

A cell designed for MBC operation e.g. in four states is typically operable as an SBC cell with two states. For example, Conley et al. in U.S. Pat. No. 6,426,893 incorporated by reference for all purposes as if fully set forth herein, disclosed using both MBC and SBC modes within the same device, selecting certain parts of the device to operate with highest density in MBC mode, while other parts are used in SBC mode to provide better performance.

MBC devices provide a significant cost advantage. An MBC device with two bits per cell requires about half the area of a silicon wafer than an SBC of similar capacity. However, there are drawbacks to using MBC flash. Average read and write times of MBC memories are longer than of SBC memories, resulting in worse performance. Also, the reliability of MBC is lower than SBC. The difference between the threshold voltage ranges in MBC are much smaller than in SBC. Thus, a disturbance in the threshold voltage (e.g. leakage of stored charge causing a threshold voltage drift or interference from operating neighboring cells) that are insignificant in SBC because of the large gap between the two states, may cause an MBC cell to move from one state to another, resulting in an erroneous bit. The end result is a lower performance specification of MBC cells in terms of data retention time or the endurance of the device to many write/erase cycles.

Another ramification of the lower reliability of MBC devices compared to SBC devices is the required level of error correction. Manufacturers of SBC NAND flash devices typically advise users to apply an Error Correction Code (ECC) capable of correcting 1 bit error in each page of 512 bytes of data. But data sheets of MBC NAND flash devices typically advise applying an ECC capable of correcting 4 bit errors in each page of 512 bytes of data. For pages of size 2048 bytes such as in the case of NAND devices known as "large block devices", the suggestion is to apply error correction per each portion of 512 bytes of the page. The present invention applies to all types of flash devices, regardless of page size. In this application the term "N-bit ECC" refers to an ECC scheme capable of correcting N bit errors in 512 bytes of data, if the 512 bytes are the size of one page, less than one page, or more than one page.

NAND flash devices are non-executable. Code execution requires random access in the sense that each byte is immediately accessible to the processor of the system independently of any other byte. NAND flash devices do not fully support random access as required for code execution. Instead, NAND devices support only serial access within a page, so that a processor has to first instruct the flash device to load a specified page from the storage array into a device-internal buffer, and then the contents of the buffer are serially shifted out of the flash device. NAND flash devices do not support directly executing a processor's code, e.g. boot code for booting an operating system. In order to use NAND flash memory devices for storing the boot code, there are different approaches. A common approach is to copy or "shadow" the boot code from the flash device into another type of memory, e.g. volatile RAM that is directly executable. Shadowing the boot code provides a solution for executing the shadowed boot code; but how is the shadowing performed? The boot code stored in non-executable memory cannot copy itself for instance into RAM! There are several approaches for executing the booting code. One approach is to have the boot code stored in a separate device that does support direct execution. The separate device may be an EEPROM NOR flash, or a ROM embedded within the CPU. In these cases, the boot code starts to run from executable memory. The boot code copies additional code from the non-executable flash memory to RAM, and then performs a jump into the additional code and continues with system initialization tasks. A second approach for executing boot code uses non-volatile memory and employs a hardware-supported mechanism that upon power-up automatically copies the contents of a previously-defined portion of the flash memory into executable memory, and system hardware is configured to start execution from the executable memory. The second approach is used with the hardware-supported mechanism implemented either within the flash device (as is the case in the DiskOnChip™ flash devices manufactured and sold by M-Systems of Kfar-Saba, Israel), or within the processor of the system (as is the case with some of the OMAP processors manufactured and sold by Texas Instruments).

Executable code compared with other types of data are relatively intolerant to bit errors. A single bit error in executable code of a processor might turn a processor command into a completely different command, changing the flow of the program, and most probably rendering the program useless. Therefore, there is a requirement to insure the code read from the flash device to the system's processor for execution is provided without errors.

There are several approaches to insure error-free execution of boot code stored in a non-executable non-volatile memory. One approach uses circuitry either integrated within the memory die or in a memory controller logically attached to the memory die, and relies on using redundancy to store the code. For example, four independent copies of the boot code are stored in the non-volatile memory. The automatic-loading hardware mechanism responsible for shadowing the boot code to executable memory has circuitry for Error Detection Coding (EDC) that enables the hardware mechanism to detect the bit errors in the shadowed code. Alternatively, circuitry for ECC in the loading mechanism may be used, however, ECC in the loading mechanism is typically avoided so as to reduce hardware complexity and cost. If the EDC circuitry detects errors in the code during shadowing, the EDC circuit without the processor's involvement discards the erroneous copy of the code and instead loads the second copy. Again, if errors are detected while copying the second copy, the second copy is also discarded and the third copy is used. All four copies are tried. The probability that all four copies will turn out to be erroneous is very small. This approach used by the M-Systems' DiskOnChip™ devices, suffices for assuring a reliable system boot.

A second approach to insure reliability of the boot code includes a hardware flash controller typically embedded in the processor that is configured, upon power-up, to automatically read the boot code from a previously determined address in the non-volatile memory (usually address zero) into an executable memory embedded within the controller. The controller includes not only EDC circuitry for detecting bit errors in the code, but also ECC circuitry for correcting them. This is the more common approach in current generation processors targeted for the mobile phones market, as for example in Texas Instruments' OMAP 1710 processor.

When processors of the current generation were designed, MBC NAND flash devices were not very common in the market and SBC devices were the norm. Therefore, designs of current processors ignore unique considerations of MBC devices. As typical SBC NAND devices are specified to guarantee no more than one bit error per 512 bytes, the flash controller of those processors is provided with ECC circuitry capable of correcting one error per 512 bytes. If the shadowed boot code happens to have more than one bit error in any 512-bytes section, sufficient error correction might not take place, and the system may not boot. Although MBC and SBC NAND devices have very similar electrical and logical interface, it is still not practical to boot the system from an MBC device, since the MBC device does not guarantee a sufficiently low number of errors to guarantee successful boot. As mentioned above, typical MBC NAND devices are specified to four bit errors per 512 bytes. Therefore, if an MBC NAND device is connected to the processor for providing the boot code, the MBC NAND device might have up to 4 bit errors in the first boot sector of 512 bytes. The processor's flash controller, even if able to detect the errors, will not be able to correct them, resulting in an attempt to execute erroneous boot code, most probably resulting in lock-up causing a hanging cellular phone, or digital camera.

Although MBC NAND is a mature technology and available in mass production lots, MBC NAND technology cannot be used by many processors in the market, even though the technology otherwise satisfies most system requirements. This is a major drawback since MBC devices require less space on the silicon wafer compared with SBC devices of similar storage capacity and hence MBC devices provide a major cost reduction.

There is thus a need for, and it would be highly advantageous to have, a way of utilizing MBC flash technology with current processors.

SUMMARY OF THE INVENTION

According to principles of the present invention there is provided a method for booting a computerized system, the method including: (a) providing a flash memory device that includes a plurality of memory cells grouped into a plurality of blocks, the device being configured so that at least one of the blocks is always operated only in a mode in which M bits are stored per cell and never in a mode in which more than M bits are stored per cell, and so that a remainder of the blocks is always operated only in a mode in which N>M bits are stored per cell and never in a mode in which only M bits are stored per cell, where M and N are integral numbers; (b) upon powering up the computerized system: (i) retrieving an initialization program for the booting from at least one block storing M bits per cell, (ii) correcting at least one error in the initialization program, using a first error correction method, and (iii) executing the initialization program; and (c) upon completing the executing: (i) accessing at least one remaining block storing N bits per cell, and (ii) correcting data accessed in the at least one remaining block, using a second error correction method that corrects more errors per block than said first error correction method. Preferably, M=1 and N=2, or M=1 and N=4, or M=2 and N=4. Preferably, only one block stores only M bits per cell. Preferably, the one or more errors in the initialization program are corrected using a controller of the flash memory device. Preferably, the data accessed in the one or more remaining blocks are corrected using a processor of the system.

According to various aspects of the present invention there is provided a flash memory device including a plurality of memory cells grouped into a plurality of blocks, the device being configured so that (a) at least one block always is operated only in a mode in which M bits are stored per cell and never in a mode in which more than M bits are stored per cell, an initialization program for booting a computer system being stored in at least one of the at least one block, and so that (b) a remainder of the blocks always is operated only in a mode in which N>M bits are stored per cell, and never in a mode in which only M bits are stored per cell, wherein N and M are integral numbers. Preferably, M=1 and N=2, or M=1 and N=4, or M=2 or N=4. Preferably, only one block stores only M bits per cell.

According to an additional embodiment there is provided a method of operating a computerized system, the method including: (a) providing a flash memory device that includes a plurality of memory cells grouped into a plurality of blocks, the device being configured so that at least one of the blocks is always operated only in a mode in which M bits are stored per cell and never in a mode in which more than M bits are stored per cell, and so that a remainder of the blocks is always operated only in a mode in which N>M bits are stored per cell and never in a mode in which only M bits are stored per cell, where M and N are integral numbers; (b) storing, in the at least one block, an initialization program for booting the computerized system; (c) upon powering up the system, retrieving the initialization program from the at least one block and executing the initialization program; and (d) upon completing the executing, accessing at least one other block from among the remainder of the blocks.

According to yet another embodiment there is provided a computer system, including: (a) a flash memory device including a plurality of memory cells grouped into a plurality of blocks, the device being configured so that at least one the block is always operated only in a mode in which M bits are stored per cell and never in a mode in which more than M bits are stored per cell, where M and N are integral numbers, and so that a remainder of the blocks is always operated only in a mode in which N>M bits are stored per cell and never in a mode in which only M bits are stored per cell, where M and N are integral numbers, and wherein an initialization program for booting the computer system is stored in at least one of the at least one block; and (b) a processor for: (i) retrieving and executing the initialization program, and (ii) accessing at least one block from among the remainder of the blocks.

According to yet another embodiment there is provided a computer system, including: (a) a flash memory device including a plurality of memory cells grouped into a plurality of blocks, wherein at least one block stores in M bits per cell an initialization program for booting the computer system; (b) a processor operative to: (i) retrieve and execute the initialization program, and (ii) access at least one remaining block storing N bits per cell, wherein N is greater than M and wherein N and M are integral numbers; and (c) a controller operative to correct errors in data that are retrieved from the flash memory device by the processor only if the data are stored M bits per cell. Preferably, M=1 and N=2 or 4. Preferably, the flash memory device is a NAND flash memory device. Preferably, only one block stores only M bits per cell. Preferably, the processor is operative to correct errors in data that are retrieved from the flash device by the processor and that are stored N bits per cell.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of a system and method of accessing a flash memory device with either one bit per cell or more than one bit cell. In particular, the present invention is based on causing the MBC flash device to emulate the behavior and characteristics of an SBC device during booting.

The principles and operation of a system and method of accessing a flash memory device with either one bit per cell or more than one bit cell, according to the present invention, may be better understood with reference to the drawings and the accompanying description.

Before explaining embodiments of the invention in detail, it is to be understood that the invention is not limited in its application to the details of design and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting. The term "programming" the flash memory as used herein refers to writing data to the flash memory. The term "accessing" flash memory as used herein refers to writing data to and reading data from the flash memory. The term "to boot" as used herein refers to load an initial program, such as at least a first portion of an operating system on a machine. The terms "boot code", "initialization code" are used herein interchangeably. The terms "code" and "program" are used herein interchangeably. The term "computerized system" refers to any machine including an electronic digital processor.

By way of introduction, the present invention is based on the following:

When the MBC cells are operated in SBC mode, the cells receive characteristics similar to characteristics of "regular" SBC cells, including reliability characteristics.

An internal sequencer within the flash device receives write commands and translates the write commands into a sequence of programming pulses with certain voltage and timing values. The difference in reliability between the MBC cells and SBC cells is the result of the respective programming sequences for the MBC cells and the SBC cells. In the SBC case, only two states of the cells are defined on the threshold voltage axis, while in the MBC case four states must be defined on the voltage axis. But if an MBC cell is programmed with the programming sequence of an SBC device, the cell behaves as an SBC cell. Therefore an MBC page programmed with the programming sequence of an SBC device, has no more than one bit error per 512 bytes.

Figure 2A:
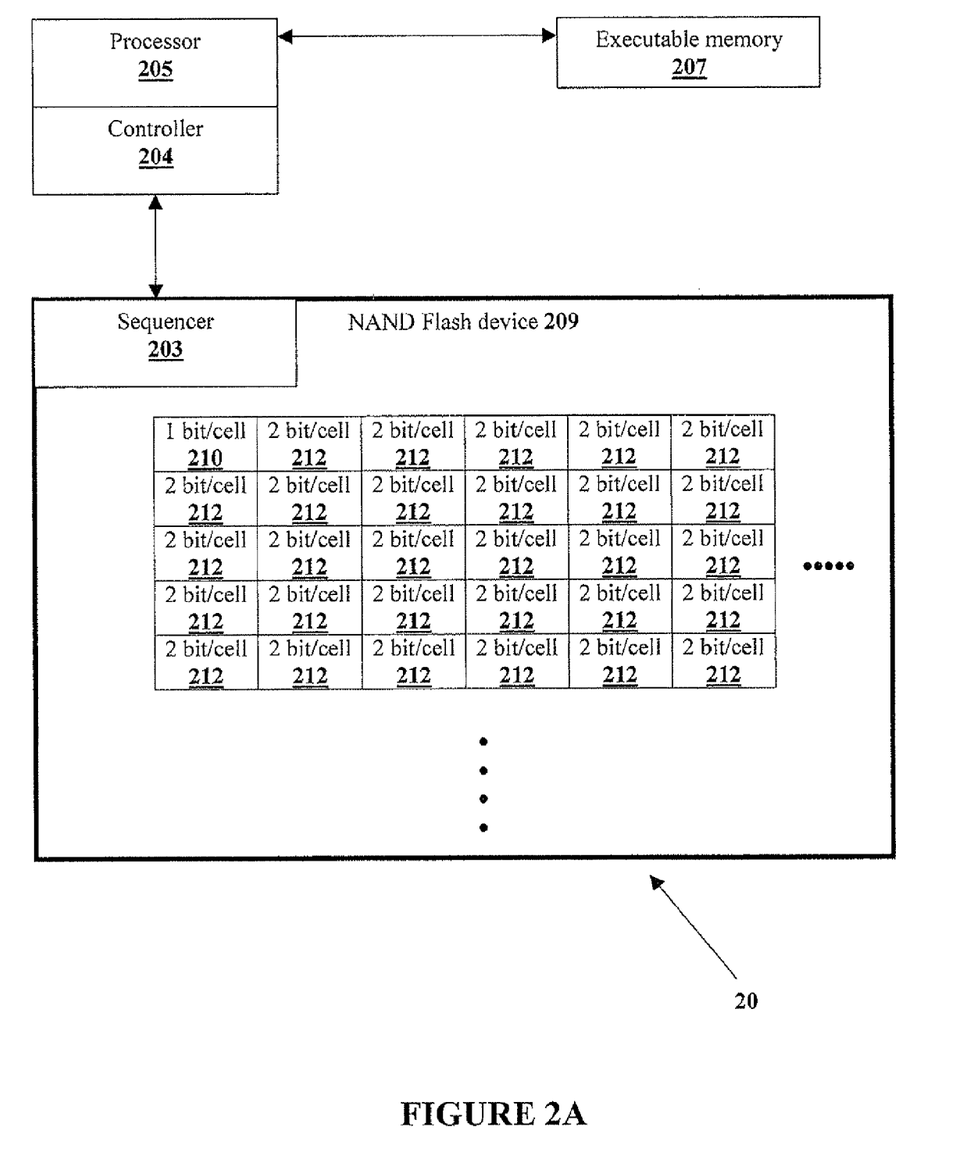
FIGS. 2A-2C are simplified drawings of memory maps of a flash memory device according to an embodiment of the present invention.
Figure 2B:
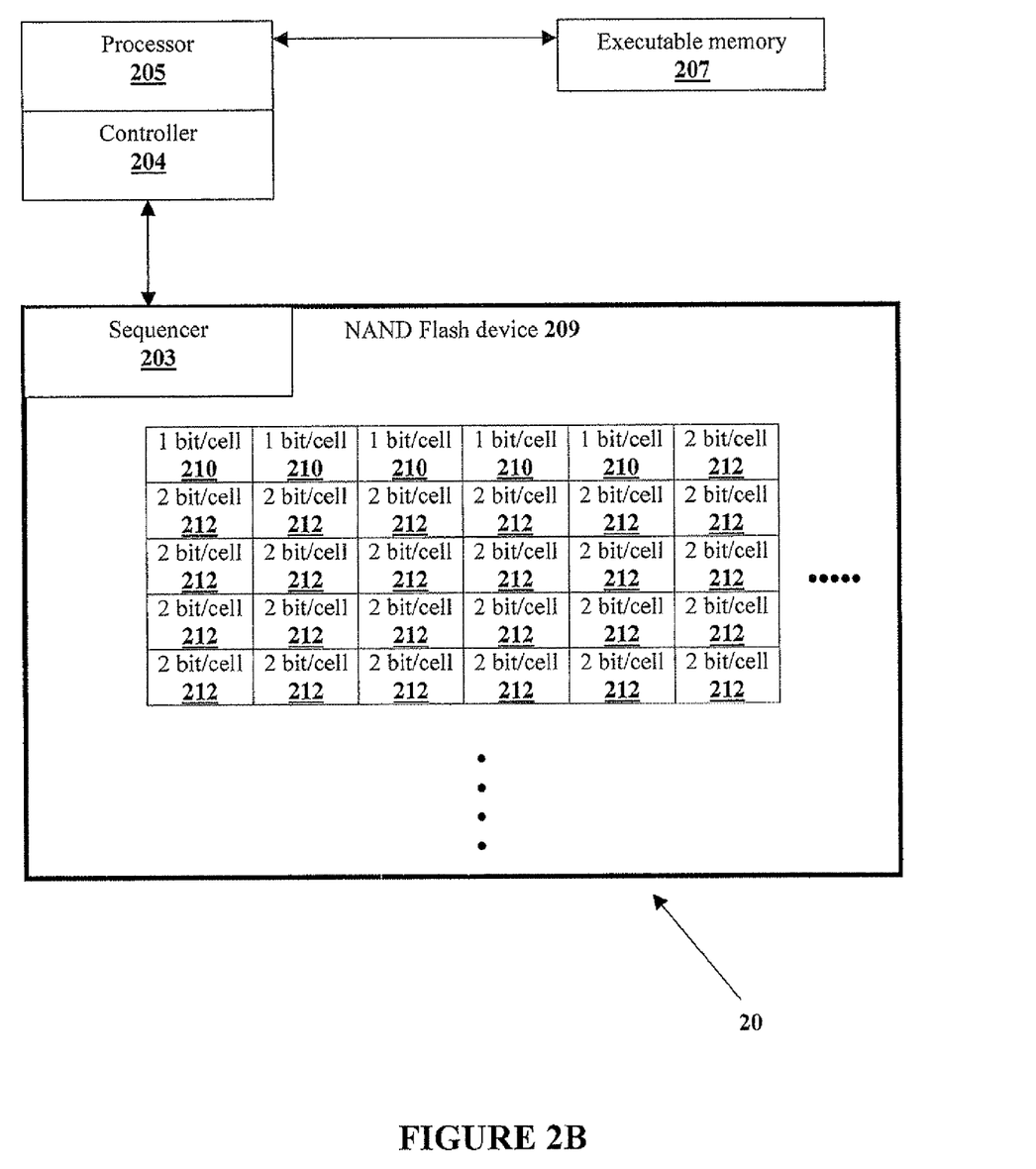
Figure 2C:
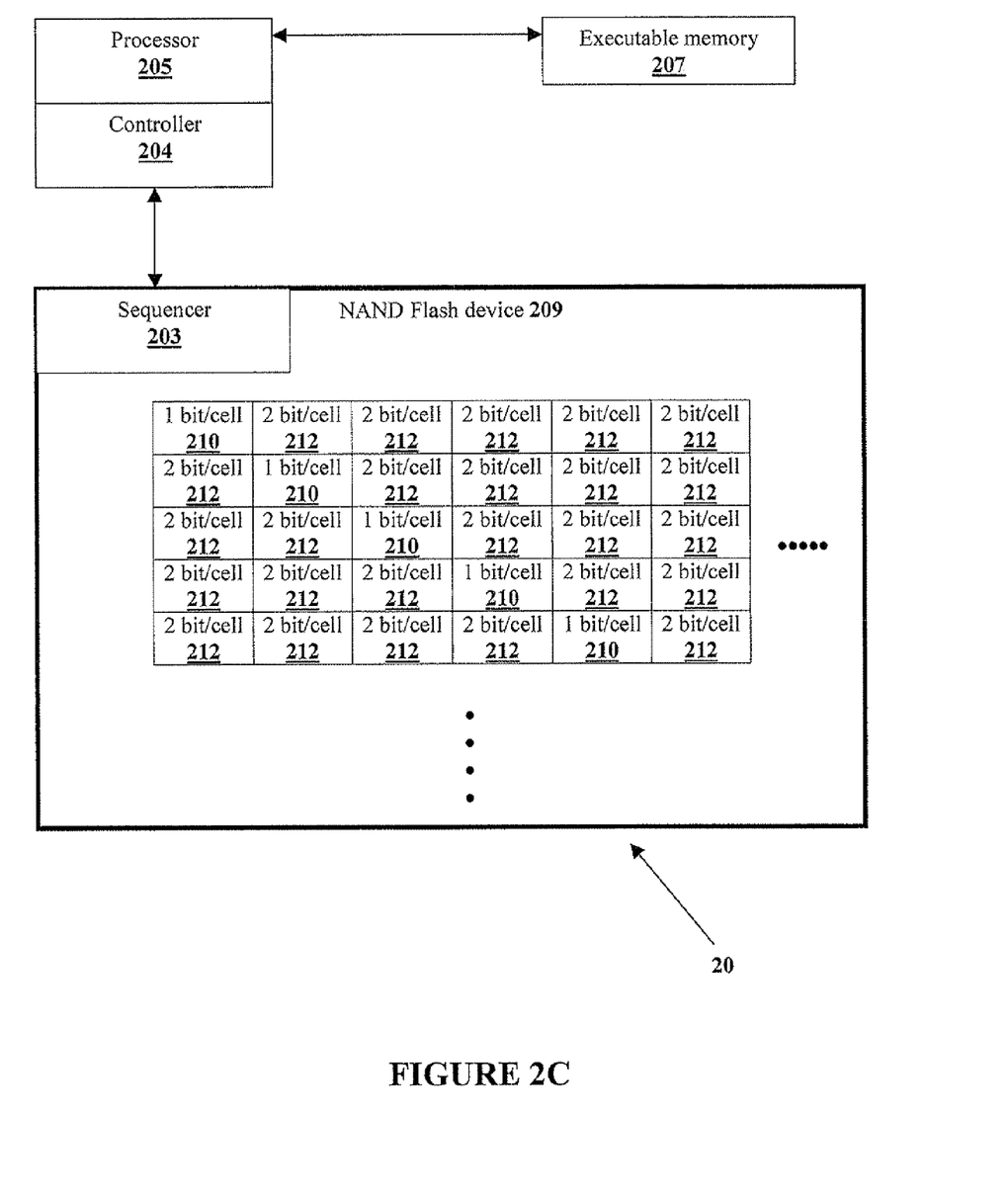

Reference is now made to FIGS. 2A, 2B and 2C, simplified drawings of a computerized system 20, according to an embodiment of the present invention. System 20 typically includes a processor 205 connected to executable memory 207. Processor 205 includes or is integrated with a flash controller 204. Sequencer 203 of an MBC NAND flash device 209 is configured to always handle the first one or first few blocks 210 (e.g. the first 5 blocks or the first 10 blocks) of the device as SBC blocks while always handling all other blocks 212 as MBC blocks, e.g. with 2 bits/cell. SBC reliability is achieved for first blocks 210 while benefiting from the extra storage capacity of remaining blocks 212 using MBC technology. Only very few blocks 210 (possibly only one, as illustrated in FIG. 2A, or only five, as illustrated in FIG. 2B) have to operate in SBC mode. The boot code that must be retrieved from flash memory 209 by processor 205 with low number of errors is usually very short, typically requiring just a single block 210 to store. The rest of the code, i.e. second-stage code, does not require such high reliability. Since the second-stage code is shadowed to executable memory 207, the second stage code can be checked while being copied and (if needed) corrected by software ECC routines by processor 205. Therefore only few blocks 210 need to achieve SBC-level reliability, and the amount of storage provided by device 209 is only slightly reduced.

NAND flash device 209 of the present invention is basically a prior art MBC NAND flash memory device further configured so that the first one or first few of its blocks 210 always operate only in SBC mode. When the system's critical boot code is stored only in SBC block(s) 210, device 209 can serve as the boot device of processor 205 that has flash controller 204 capable of only 1-bit ECC. The pages accessed during the initial boot are guaranteed to be reliable enough for the ECC circuitry of controller 204 to correct them, and therefore successful system boot with no lock-up is achieved.

Figure 3:
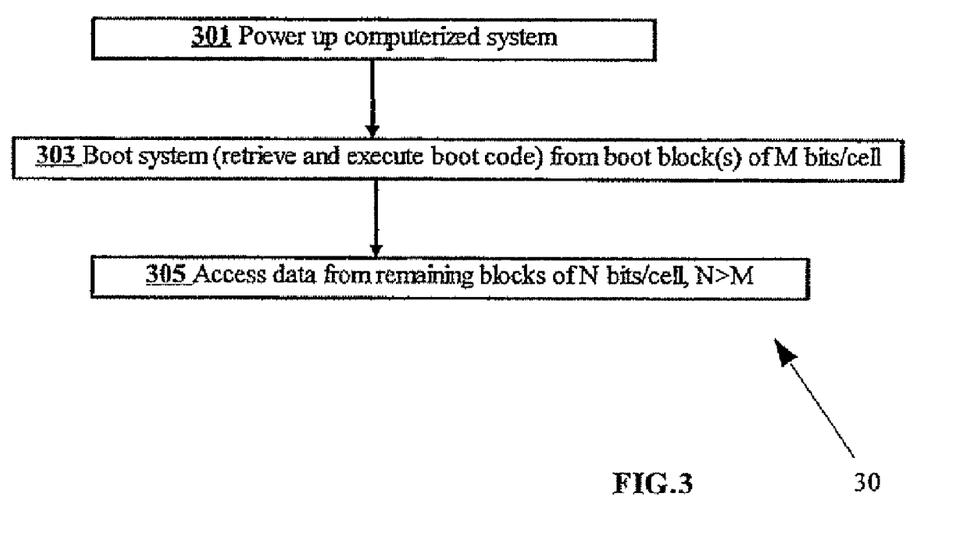
FIG. 3 is a simplified drawing of a method for accessing a flash memory device, according to an embodiment of the present invention.

Reference is now made to FIG. 3 illustrating a simplified method 30 according to an embodiment of the present invention. Method 30 includes powering up (step 301) computerized system 20 including flash memory device 209 and processor 205. On powering up (step 301) system 20 is booted, by retrieving and executing (step 303) an initialization program, i.e. boot code stored in SBC block(s) 210. After successful booting (step 303) processor 205 accesses (step 305) MBC blocks 212 of flash memory device 209.

While the above presentation of the invention uses as an example flash device 209 capable of operating its cells with either two bits per cell or one bit per cell, the invention is not limited to this specific case. For example, a flash device capable of storing four bits per cell (which will typically have a reliability specification requiring the correction of many more than four bits per 512 bytes), can similarly be used for booting a system with processor 205 having only 1-bit ECC capability, provided the first few blocks 210 are set to always operate only in one-bit-per-cell mode. Furthermore, for processors designed to work with two-bits-per-cell devices and having 4-bit ECC capability, the four-bits-per-cell flash device could also be used for booting a system using such processors by setting the first blocks to always operate only in two-bits-per-cell mode, as the ECC circuitry is able to cope with the higher number of errors (four bit errors per 512 bytes) generated by this mode. Therefore an embodiment of the present invention includes a method of booting a system from a non-executable flash memory device capable of storing N bits per cell (N>1), where the blocks storing the boot code store less than N bits per cell.

According to an embodiment of the present invention, blocks 210 storing for instance 1 bit/cell are not necessarily contiguous blocks. Blocks 210 are either physically sequential to a first block 210 or include a first block 210 with other blocks 210 distributed throughout device 209, as illustrated in FIG. 2C for five blocks 210. The initial boot code in the first block 210 may contain code that directs the loading of additional boot code from other blocks 210.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

As such, those skilled in the art will appreciate that the conception, upon which this disclosure is based, may readily be utilized as a basis for the designing of other methods and systems for carrying out the several purposes of the present invention. It is important, therefore, that the claims be regarded as including such equivalent constructions insofar as they do not depart from the spirit and scope of the present invention.

While the invention has been described with respect to a limited number of embodiments, it will be appreciated that many variations, modifications and other applications of the invention may be made.

What is claimed is:

1. A method for booting a computerized system, the method comprising:
    (a) providing a flash memory device that includes a plurality of memory cells grouped into a plurality of blocks, the flash memory device being configured so that at least one of the blocks is operated in a mode in which M bits are stored per cell, and so that remaining blocks of the plurality of blocks are operated in a mode in which N>M bits are stored per cell, where M and N are integral numbers;
    (b) upon powering up the computerized system:
        (i) retrieving an initialization program for the booting from the at least one of the blocks which is operated in the mode in which only M bits are stored per cell,
        (ii) correcting at least one error in the initialization program, using a flash controller's circuitry for correcting bit errors, and
        (iii) executing the initialization program; and
    (c) upon completing the executing:
        (i) accessing data from at least one of the remaining blocks storing N bits per cell, and
        (ii) correcting the data accessed from the at least one of the remaining blocks storing N bits per cell, using a software error correction code (ECC) routine of a processor, the software error correction code (ECC) routine corrects more errors per block than the flash controller's circuitry for correcting bit errors, and the processor is integrated with the flash controller and is connected to the flash memory device.

2. The method, according to claim 1, wherein M equals 1 and N equals 2.

3. The method, according to claim 1, wherein M equals 1 and N equals 4.

4. The method, according to claim 1, wherein the at least one of the blocks which is operated in the mode in which only M bits per cell are stored per cell, is one block.

5. The method according to claim 1, wherein:
the step (c) (ii) is performed by the processor while copying the data from the at least one of the remaining blocks storing N bits per cell to an executable memory connected to the processor.

6. The method according to claim 1, wherein:
the flash controller is a hardware flash controller embedded in the processor.

7. The method according to claim 1, further comprising:
in connection with step (b)(ii), detecting the at least one error in the initialization program using error detection coding (EDC) circuitry of the flash controller.

8. A method of operating a computerized system, the method comprising:
(a) providing a flash memory device that includes a plurality of memory cells grouped into a plurality of blocks, the flash memory device is connected to a processor, the processor is integrated with a flash controller, the flash memory device being configured so that at least one of the blocks is operated in a mode in which only M bits are stored per cell, and so that remaining blocks of the plurality of blocks are operated in a mode in which N>M bits are stored per cell, where M and N are integral numbers;
(b) storing, in the at least one of the blocks which is operated in the mode in which only M bits are stored per cell, an initialization program for booting the computerized system;
(c) upon powering up the system, retrieving the initialization program from the at least one of the blocks which is operated in the mode in which only M bits are stored per cell and executing the initialization program;
(d) correcting at least one error in the initialization program, using circuitry for correcting bit errors, the circuitry for correcting bit errors is in the flash controller;
(e) upon completing the executing, accessing data from at least one of the remaining blocks storing N bits per cell; and
(f) correcting errors in the data from the at least one of the remaining blocks storing N bits per cell using a software error correction code routine of the processor that corrects more errors per block than the flash controller's circuitry for correcting bit errors.

9. The method according to claim 8, wherein:
the step (f) is performed by the processor while copying the data from the at least one of the remaining blocks storing N bits per cell to an executable memory connected to the processor.

10. The method according to claim 8, wherein:
the flash controller is a hardware flash controller embedded in the processor.

11. The method according to claim 8, further comprising:
in connection with step (d), detecting the at least one error in the initialization program using error detection coding (EDC) circuitry of the flash controller.

12. A computerized system, comprising:
a flash memory device;
a flash controller for the flash memory device, the flash controller includes circuitry for correcting bit errors; and
a processor which is integrated with the flash controller and which is connected to the flash memory device, the processor includes a software error correction code (ECC) routine;
the flash memory device includes a plurality of memory cells grouped into a plurality of blocks, the flash memory device being configured so that at least one of the blocks is operated in a mode in which only M bits are stored per cell, and so that remaining blocks of the plurality of blocks are operated in a mode in which N>M bits are stored per cell, where M and N are integral numbers;
the flash controller, upon a powering up of the computerized system: (i) retrieves an initialization program for booting from the at least one of the blocks which is operated in the mode in which only M bits are stored per cell, (ii) corrects at least one error in the initialization program using the flash controller's circuitry for correcting bit errors, and (iii) executes the initialization program; and
the processor: (i) accesses data from at least one of the remaining blocks storing N bits per cell, and (ii) corrects the data accessed from the at least one of the remaining blocks storing N bits per cell using the software ECC routine, the software ECC routine corrects more errors per block than the flash controller's circuitry for correcting bit errors.

13. The computerized system according to claim 12, further comprising:
an executable memory connected to the processor, the processor corrects the data accessed from the at least one of the remaining blocks storing N bits per cell using the software ECC routine while copying the data from the at least one of the remaining blocks storing N bits per cell to the executable memory.

14. The computerized system according to claim 12, wherein:
the flash controller is a hardware flash controller embedded in the processor.

15. The computerized system according to claim 12, wherein:
the flash controller detects the at least one error in the initialization program using error detection coding (EDC) circuitry of the flash controller.

* * * * *